(12) United States Patent
Akane et al.

(10) Patent No.: US 7,969,071 B2
(45) Date of Patent: Jun. 28, 2011

(54) CRYSTAL UNIT FOR SURFACE MOUNTING HAVING PILLOW MEMBERS WITH TWO-LAYER STRUCTURE

(75) Inventors: Katsunori Akane, Saitama (JP); Koji Kubota, Saitama (JP)

(73) Assignee: Nithon Dempa Kogyo Co., Ltd. (JP)

( * ) Notice: Subject to any disclaimer, the term of this patent is extended or adjusted under 35 U.S.C. 154(b) by 48 days.

(21) Appl. No.: 12/328,203

(22) Filed: Dec. 4, 2008

(65) Prior Publication Data

US 2009/0140613 A1 Jun. 4, 2009

(30) Foreign Application Priority Data

Dec. 4, 2007 (JP) .................... 2007-313211

(51) Int. Cl.
*H01L 41/053* (2006.01)
(52) U.S. Cl. ....................... 310/348; 331/158
(58) Field of Classification Search ........... 310/348; 331/158
See application file for complete search history.

(56) References Cited

U.S. PATENT DOCUMENTS

| | | | |
|---|---|---|---|
| 5,841,217 A * | 11/1998 | Kizaki et al. | 310/348 |
| 6,396,201 B1 * | 5/2002 | Ide et al. | 310/353 |
| 6,628,048 B2 * | 9/2003 | Moon et al. | 310/348 |
| 7,095,161 B2 * | 8/2006 | Unno et al. | 310/348 |
| 7,116,039 B2 * | 10/2006 | Arai et al. | 310/341 |
| 7,180,225 B2 * | 2/2007 | Sashida et al. | 310/330 |
| 7,247,978 B2 * | 7/2007 | Robinson et al. | 310/345 |
| 7,449,820 B2 * | 11/2008 | Moriya | 310/348 |
| 7,482,735 B2 * | 1/2009 | Harada et al. | 310/348 |
| 2007/0145863 A1 * | 6/2007 | Kusai | 310/348 |

FOREIGN PATENT DOCUMENTS

| | | | |
|---|---|---|---|
| EP | 623807 A1 * | 11/1994 | |
| JP | 8-330886 A | 12/1996 | |
| JP | 2001-94386 A | 4/2001 | |
| JP | 2004-48384 A | 2/2004 | |
| JP | 2005-198237 A | 7/2005 | |
| JP | 2008-206002 A | 9/2008 | |

OTHER PUBLICATIONS

Office Action for Japanese Patent Application No. 2007-313211 dispatched Jun. 8, 2010 with partial English translation.

* cited by examiner

*Primary Examiner* — J. SanMartin
(74) *Attorney, Agent, or Firm* — Cantor Colburn LLP

(57) ABSTRACT

The crystal unit for surface mounting includes a container body having a recess, a pair of holding terminals formed on an inner bottom surface of the recess and a crystal blank provided with excitation electrodes on both principal surfaces thereof, having a first end and a second end with lead-out electrodes extending from the excitation electrodes toward both sides of the first end. Both sides of the first end are fixed to the holding terminals using a conductive adhesive. Pillow members protruding from the inner bottom surface are provided on the inner bottom surface of the recess at positions corresponding to corners on both sides of the second end. A bank having a height lower than a height of the pillow members is provided on the inner bottom surface of the recess at an intermediate position between the pair of pillow members.

7 Claims, 3 Drawing Sheets

CRYSTAL UNIT FOR SURFACE MOUNTING HAVING PILLOW MEMBERS WITH TWO-LAYER STRUCTURE

BACKGROUND OF THE INVENTION

1. Field of the Invention

The present invention relates to a quartz crystal unit with a quartz crystal blank hermetically sealed in a container, and more particularly, to a crystal unit for surface mounting capable of optimally maintaining a vibration characteristic even when a mechanical shock is applied thereto.

2. Description of the Related Art

Since quartz crystal units for surface mounting with a quartz crystal blank hermetically sealed in a container are small and light, such crystal units are incorporated, as frequency and time reference sources, together with an oscillation circuit in portable electronic devices represented by cellular phones. In recent years, there is a demand for crystal units for surface mounting which prevent, when a shock is applied thereto, peeling of a crystal blank inside the crystal units or deterioration of vibration characteristics.

FIG. 1A is a cross-sectional view of a conventional crystal unit for surface mounting and FIG. 1B is a partially enlarged cross-sectional view of the part enclosed with a dotted line in FIG. 1A.

The illustrated crystal unit accommodates crystal blank 2 in container body 1 for surface mounting, puts metal cover 5 on the container body and keeps crystal blank 2 hermetically sealed in the container. Container body 1 is made of, for example, laminated ceramics, has a substantially rectangular plane outer shape, that is, a flat and substantially parallelepiped shape, which looks like a rectangle when seen from above when this crystal unit is mounted on a wiring board. A recess for accommodating crystal blank 2 is formed in a top surface of container body 1. On an inner bottom surface of the recess, there are provided a pair of holding terminals 3 close to the positions of both ends of one side of the inner bottom surface. Metal cover 5 is bonded to the top surface of container body 1 through seam welding or the like to close the recess and in this way crystal blank 2 is hermetically sealed within the recess.

On an outer bottom surface of container body 1, there are provided outer terminals 4 as electrode layers to be used to surface-mount container body 1 on a wiring board. Of these four outer terminals 4, a pair of outer terminals 4 located at both ends of one diagonal of the outer bottom surface of container body 1 are electrically connected to the pair of holding terminals 3 via a conductive path formed in the lamination plane between ceramic layers in container body 1. The remaining two outer terminals 4 are used as grounding terminals. Outer terminals 4 used as the grounding terminals are electrically connected to metal cover 5 via a conductive path (not shown) formed in container body 1.

As shown in FIG. 2, crystal blank 2 is made of, for example, a substantially rectangular AT-cut quartz crystal blank. Excitation electrodes 6a are formed on both principal surfaces thereof such that excitation electrodes 6a are located in oscillation regions of crystal blank 2. Lead-out electrodes 6b extend from the pair of excitation electrodes 6a toward both sides of one end of crystal blank 2. Crystal blank 2 is fixed and held within the recess of container body 1 by fixing these lead-out electrodes 6b to holding terminals 3 at the positions where the pair of lead-out electrodes 6b are led out using, for example, conductive adhesive 7 and is electrically and mechanically connected to container body 1.

Examples of the cross-sectional shape along the longitudinal direction of crystal blank 2 include a bevel shape, convex shape and flat shape. A bevel shaped crystal blank has a thickness which is constant over a certain range of breadth of the central part and decreasing from the central part toward the periphery. A convex shaped crystal blank has a gently varying thickness which becomes a maximum at the center of the crystal blank. A flat shaped crystal blank has a constant thickness over the entire range. When the vibration frequency is approximately 30 MHz or more, crystal blank 2 is formed into a flat shape. On the other hand, when the vibration frequency is lower than 30 MHz, crystal blank 2 is formed into a bevel shape or convex shape through edge dressing to confine vibration energy within the central region of crystal blank 2 and reduce crystal impedance (CI) of crystal blank 2.

In the following explanations, of both ends in the longitudinal direction of crystal blank 2, one end which is fixed to container body 1 by conductive adhesive 7 is called a "first end" and the other end is called a "second end." Pillow member 8 protruding from the inner bottom surface of container body 1 is provided in the central part in the width direction of the inner bottom surface at the position corresponding to the second end of crystal blank 2. The second end of crystal blank 2 is placed on pillow member 8 without being fixed to pillow member 8. The second end may also be placed above pillow member 8 so as not to contact pillow member 8.

When the cross-sectional shape in the longitudinal direction of crystal blank 2 is assumed to be a bevel shape or convex shape as described above, pillow member 8 is intended to prevent particularly the vibration region in which excitation electrode 6a of crystal blank 2 is formed from contacting the inner bottom surface of container body 1. Also in the case where the cross-sectional shape of crystal blank 2 is a flat shape, the vibration region of crystal blank 2 may also contact the inner bottom surface of container body 1 due to warpage or the like of container body 1, and therefore pillow member 8 is effective in such a case, too.

Such pillow member 8 is provided simultaneously with a tungsten (W) layer or molybdenum (Mo) layer formed as a base electrode layer making up holding terminal 3 using a printing method when ceramic green sheets, i.e., unburned ceramic raw sheets, are laminated and burned to form container body 1. Alternatively, pillow member 8 may be made of ceramics, and burned and formed a part integral with container body 1.

To reliably prevent the bottom surface of crystal blank 2 from contacting the inner bottom surface of the recess, generally, as shown in FIG. 1B, holding terminal 3 and pillow member 8 are formed with an increased thickness by printing two coats of a base electrode layer made of tungsten, molybdenum or the like. That is, as for holding terminals 3, suppose the base electrode layer has a two-layer configuration of first layer $3x$ and second layer $3y$ and the sum of the thicknesses of these layers is, for example, 30 μm.

Furthermore, pillow member 8 also has the function of reducing the swinging width of the second end of crystal blank 2 when a mechanical shock is applied to the crystal unit and maintaining the vibration characteristic of crystal blank 2 satisfactorily. Upon receiving a shock, crystal blank 2 swings around the first end as the axis, but the provision of pillow member 8 reduces the swinging width at the second end, and therefore the degree of swinging of crystal blank 2 also decreases and influences on conductive adhesive 7 which holds the crystal blank at the first end also decrease. The vibration system of crystal blank 2 including conductive adhesive 7 has less variation by shock, and can thereby maintain the vibration characteristic satisfactorily and suppress frequency variations.

On the other hand, when pillow member 8 is not provided, the swinging width on the second end side of crystal blank 2 increases when a shock is applied, the influence of the swinging also extends to conductive adhesive 7, causes a variation in the state thereof, that is, the influence reaches the vibration system and deteriorates the vibration characteristic of the crystal blank. In this way, pillow member 8 provided for the second end of crystal blank 2 is meaningful in two aspects; preventing the vibration region of crystal blank 2 from contacting the inner bottom surface of container body 1 and maintaining the vibration characteristic of the vibration system against shocks.

However, the configuration simply provided with pillow member 8 to reduce the swinging width of the second end of crystal blank 2 has limitations in preventing frequency variations due to application of consecutive shocks and aging or the like, or peeling of crystal blank 2. Therefore, as disclosed, for example, in Japanese Patent Laid-Open No. 2004-48384 (JP-A-2004-048384) and Japanese Patent Laid-Open No. 2001-94386 (JP-A-2001-094386), there is a proposal to fix the second end of crystal blank 2 to the container body using an adhesive. In this case, the locations of the second end of crystal blank 2 at which the adhesive can be applied can be both ends or one end of the side of the crystal blank at the second end or central part of such a side. In both cases, the second end of crystal blank 2 is fixed to the container body by the adhesive, preventing swinging thereof in the vertical direction. This eliminates the necessity for providing pillow member 8. However, if fixing the second end of crystal blank 2 using the adhesive eliminates the necessity for pillow member 8, the shared use of container body 1 is not made possible for the case where pillow member 8 is provided without using the adhesive and the case where the adhesive is used but pillow member 8 is not provided, which causes productivity to decrease.

Therefore, as the method of allowing fixing of the second end of crystal blank 2 using adhesive 7 as well as providing a pillow member, as shown, for example, in FIG. 3A, container body 1 with pillow members 8a, 8b provided at both ends in the width direction of the recess at the second end of crystal blank 2 may be used. FIG. 3A is a plan view of a crystal unit with a metal cover removed for convenience of explanation and shows contours of crystal blank 2 with alternate long and short dashed lines. In a case where container body 1 shown in FIG. 3A is used and the second end of crystal blank 2 needs to be fixed, both sides of the second end of crystal blank 2 are fixed using an adhesive. However, in this case, crystal blank 2 is held to container body 1 at four points and stress caused by a difference in thermal expansion coefficient between container body 1 and crystal blank 2 directly applies to crystal blank 2, which deteriorates the frequency-temperature characteristic of crystal blank 2.

On the other hand, when container body 1 shown in FIG. 3A is used and an adhesive is applied only to one of pillow members 8a, 8b to hold crystal blank 2, only one side of crystal blank 2 is fixed at the second end and the adhesive is not applied to the other side, and therefore crystal blank 2 is held by being twisted, which causes the position of crystal blank 2 to be shifted or also affects the state in which crystal blank 2 is held at the first end through conductive adhesive 7.

Alternatively, as shown in FIG. 3B, in container body 1 shown in FIG. 3A, adhesive 9 may be applied onto the inner bottom surface of the recess of container body 1 at the midpoint between two pillow members 8a, 8b and the midpoint of a side at the second end of crystal blank 2 may be fixed to container body 1 using adhesive 9. In this case, as described above, both pillow members 8a, 8b have a two-layer structure of first layer 8x and second layer 8y and have a large thickness, that is, height, and therefore the adhesive applied onto the inner bottom surface of the recess may not adhere to crystal blank 2. When the amount of adhesive 9 applied is increased, adhesive 9 may adhere to crystal blank 2, but in this case, adhesive 9 spreads in the horizontal direction, adheres to the principal surface of crystal blank 2 more than necessary and deteriorates the vibration characteristic of crystal blank 8. It is difficult to exercise control so that an appropriate amount of adhesive 9 is applied. Applying adhesive 9 onto the inner bottom surface of the recess at a position between pillow members 8a, 8b and fixing crystal blank 2 is not implementable in practical terms.

SUMMARY OF THE INVENTION

It is an object of the present invention to provide a crystal unit for surface mounting having a container body which is provided with a pillow member and also applicable to fixing of a second end of a crystal blank using an adhesive.

The object of the present invention can be attained by a crystal unit for surface mounting including a container body having a recess, a pair of holding terminals formed on the inner bottom surface of the recess and a crystal blank provided with excitation electrodes on both principal surfaces thereof, having a first end and a second end with lead-out electrodes extending from the pair of excitation electrodes toward both sides of the first end, wherein both sides of the first end of the crystal blank are fixed to the holding terminals using a conductive adhesive, pillow members protruding from the inner bottom surface are provided on the inner bottom surface of the recess at positions corresponding to corners on both sides of the second end of the crystal blank, and a bank having a height lower than a height of the pillow members is provided on the inner bottom surface of the recess at an intermediate position between the pair of pillow members.

Such a configuration allows pillow members to be provided at positions corresponding to the second end of the crystal blank on the inner bottom surface of the container body, and can thereby reduce swinging of the crystal blank at the second end. Since a bank or a ridge portion having a height lower than the height of the pillow members is provided on the inner bottom surface of the recess at the intermediate position between the pair of pillow members, applying an adhesive to this bank allows the second end of the crystal blank to be fixed to the container body. Therefore, the container body can be used commonly for both cases where the pillow members are provided and where the second end of the crystal blank is also fixed to the container body using the adhesive.

The provision of the bank in the present invention makes it possible to narrow the distance between the bank and the lower principal surface of the crystal blank and fix the crystal blank to the bank without unnecessarily increasing the thickness of the adhesive Furthermore, in the present invention, it is possible to increase the thickness of the adhesive compared to a case where the adhesive is applied onto the pillow members and can also adjust this thickness by changing the height of the bank The greater the thickness of the adhesive, the greater is the elasticity thereof, and therefore adopting an optimal value for the thickness of the adhesive can further reduce influences on the vibration characteristic of the crystal blank due to a difference in thermal expansion coefficient between the container body and crystal blank, and on the frequency-temperature characteristic in particular.

In such a crystal unit, the crystal blank is preferably fixed to the bank at the center of the second end using an adhesive. This increases the fixing strength of the crystal blank, and can thereby maintain the vibration characteristic of the crystal blank satisfactorily and improve the anti-shock characteristic against peeling or the like. The use of a conductive adhesive as the adhesive for fixing the crystal blank allows the same conductive adhesive to be applied onto both the holding terminals and the bank in the same process of manufacturing the crystal unit and improves productivity.

According to the present invention, both the pillow members and bank are provided using, for example, a printing method. In this case, the two-layer structure making up the pillow members may be constructed of a first layer formed to be common to and continuous between the pair of pillow members and a second layer provided on the first layer for each pillow member and the exposed part of the first layer is used as the bank. This makes it possible to improve the positional accuracy during printing compared to a case where the pair of pillow members and the bank are provided independently.

DETAILED DESCRIPTION OF THE PREFERRED EMBODIMENTS

Figure 2:
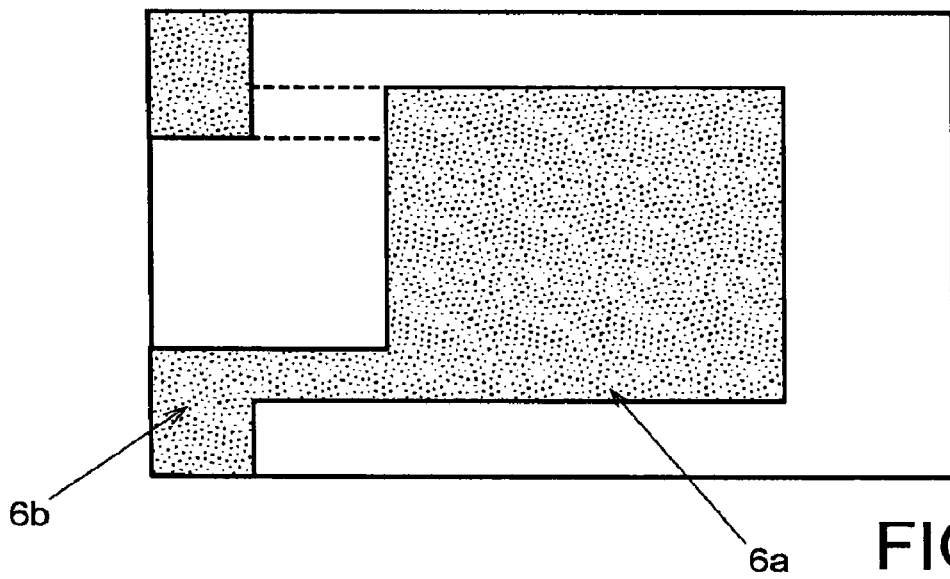
FIG. 2 is a plan view showing an example of the crystal blank.
Figure 3A:
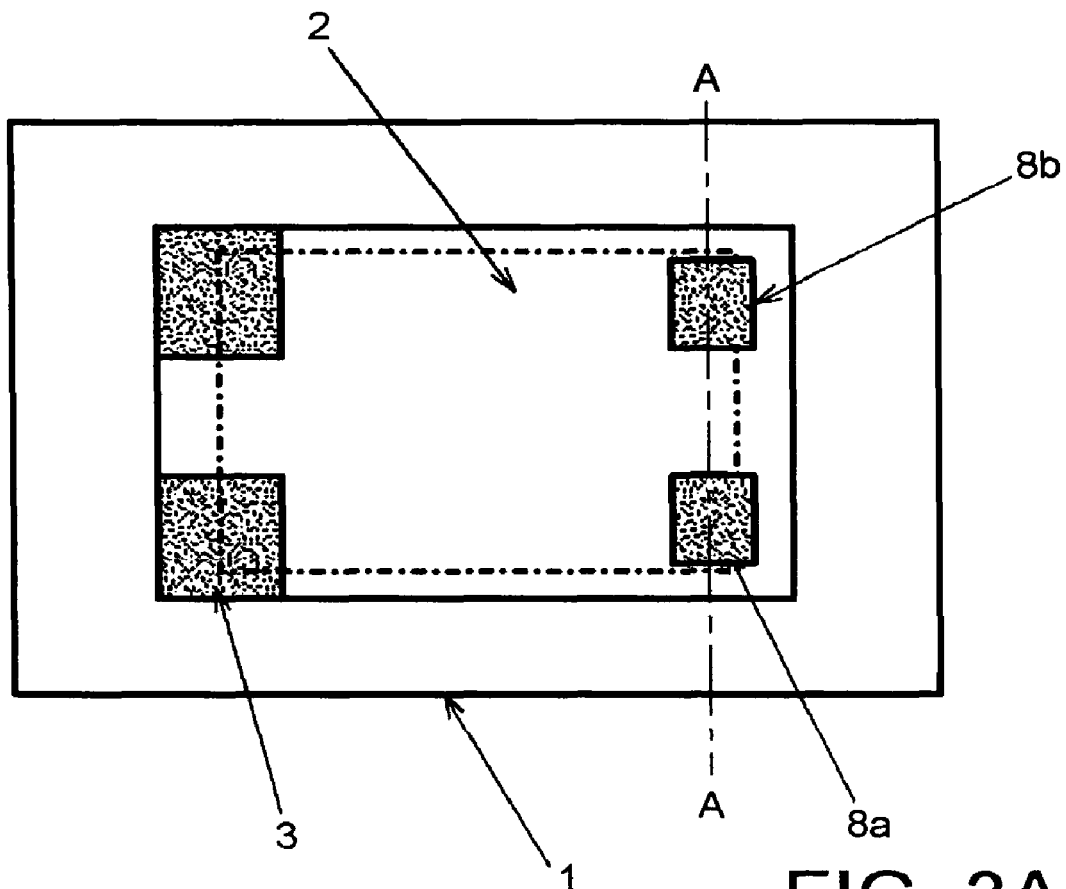
FIG. 3A is a plan view showing another example of the configuration of the conventional crystal unit for surface mounting with a cover removed.
Figure 3B:
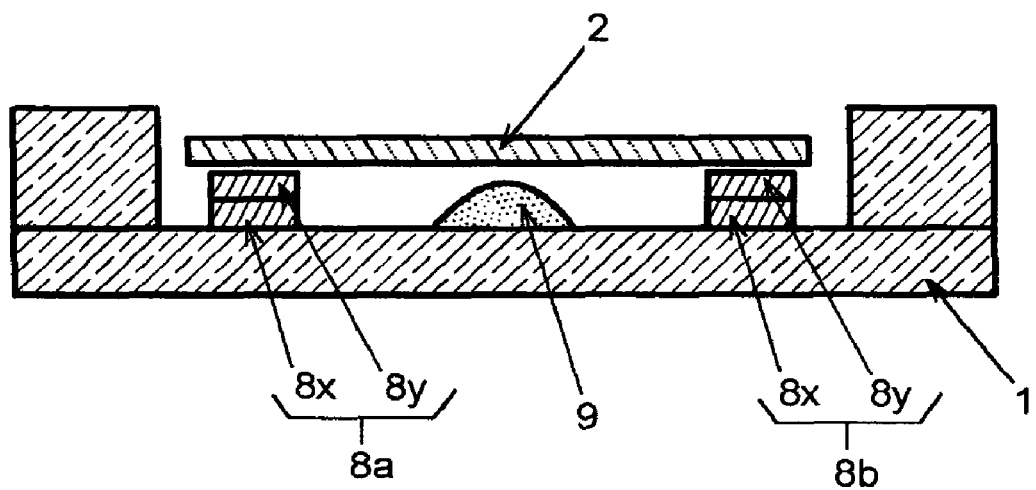
FIG. 3B is an enlarged cross-sectional view along line A-A of FIG. 3A.
Figure 4A:
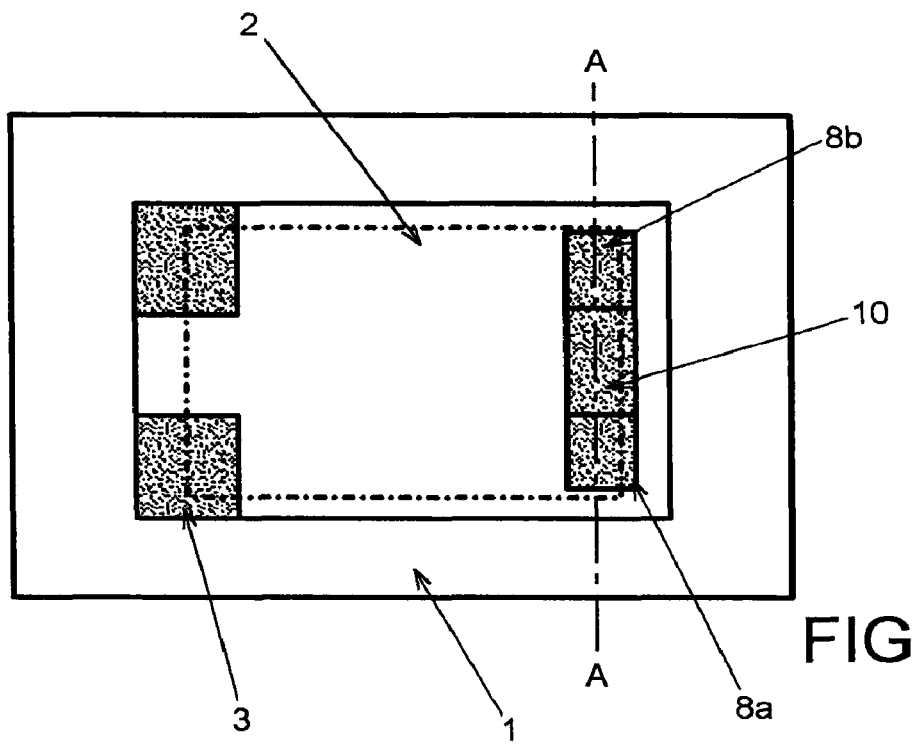
FIG. 4A is a plan view showing a crystal unit for surface mounting with a cover removed according to an embodiment of the present invention.
Figure 4B:
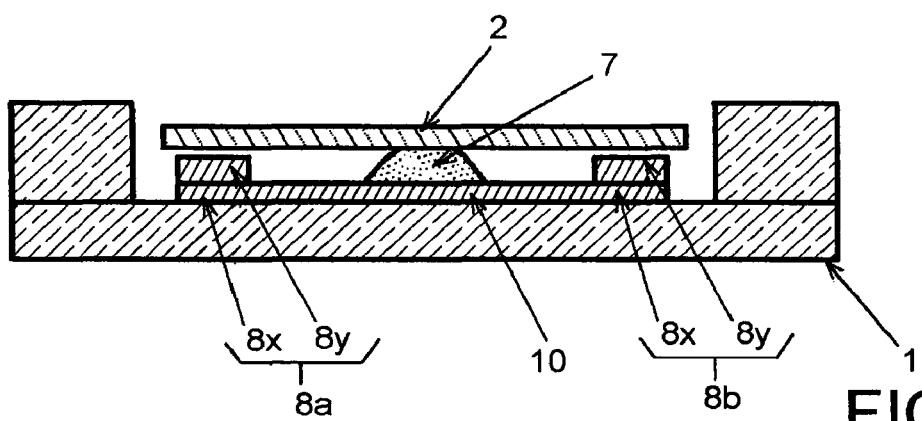
FIG. 4B is an enlarged cross-sectional view along line A-A of FIG. 4A.

In FIGS. 4A and 4B showing a crystal unit for surface mounting according to an embodiment of the present invention, the same components as those in above described FIGS. 1A, 1B, 2, 3A and 3B are assigned the same reference numerals and redundant explanations will be simplified or omitted.

The crystal unit shown in FIGS. 4A and 4B is similar to that shown in FIGS. 3A and 3B, but is different from that shown in FIGS. 3A and 3B in that a bank or ridge portion is provided between a pair of pillow members 8. For convenience of explanation, FIG. 4A shows the crystal unit with a metal cover removed.

This crystal unit accommodates crystal blank 2 within a recess of container body 1 by fixing both sides of a first end of crystal blank 2 with lead-out electrodes 6b extending from excitation electrodes 6a to holding terminals 3 provided on an inner bottom surface of the recess using conductive adhesive 7. For crystal blank 2, the one shown in FIG. 2 is used. At positions corresponding to the corners on both sides of the second end of crystal blank 2, there are provided pillow members 8a, 8b on the inner bottom surface of the recess of container body 1. That is, pillow members 8a, 8b are provided at both ends in the width direction of the recess The second end of crystal blank 2 contacts pillow members 8a, 8b or is located above pillow members 8a, 8b. The opening of the recess of container body 1 is hermetically closed with metal cover 5 (see FIG. 1A) and outer terminals 4 (see FIG. 1A) are provided in the four corners of the outer bottom surface of container body 1.

In this embodiment, holding terminals 3 and pillow members 8a, 8b are also formed using two coats in the printing method so as to secure the heights as described above, and in this way, it is possible to prevent the under surface of crystal blank 2 from contacting the inner bottom surface of the recess. Such pillow members 8a, 8b may also be made of tungsten or molybdenum as in the case of the base electrode layer of holding terminals 3 or may also be made of ceramic.

Suppose pillow members 8a, 8b are constructed in a two-layer structure of first layer 8x provided on the inner bottom surface of the recess and second layer 8y provided on first layer 8x. Here, first layer 8x is provided common to the pair of pillow members 8a, 8b. That is, first layer 8x is formed linearly and continuously so as to connect both ends of the recess in the width direction. Second layers 8y are formed independently of each other at both ends of first layer 8x so as to correspond to the pair of pillow members 8a, 8b, respectively. The part located between pillow members 8a, 8b where first layer 8x is exposed is assumed to be bank 10. The height of bank 10 is apparently smaller than the heights of pillow members 8a, 8b.

Figure 1A:
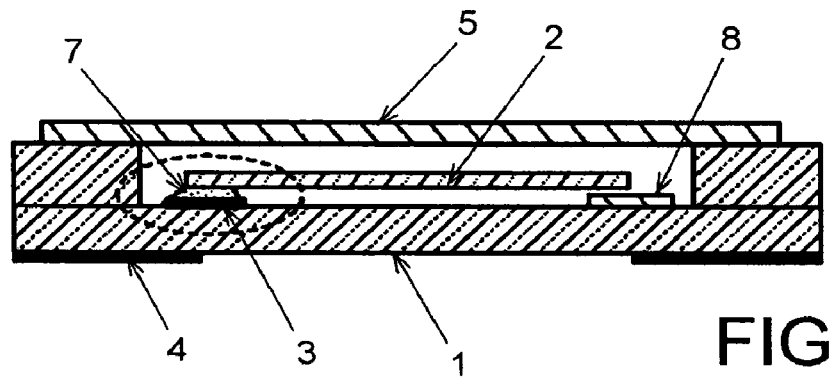
FIG. 1A is a cross-sectional view showing an example of the configuration of a conventional crystal unit for surface mounting.
Figure 1B:
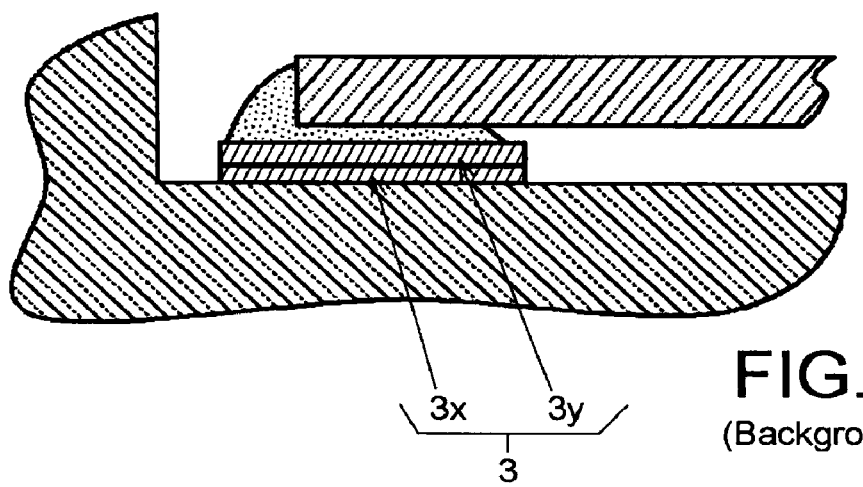
FIG. 1B is a partially enlarged cross-sectional view of the part enclosed by the dotted line in FIG. 1A.

In the case where a crystal unit is constructed using such container body 1, when the second end of crystal blank 2 need not be fixed to container body 1, silicon-based thermosetting conductive adhesive 7, for example, is applied onto holding terminals 3 as in the case of the one shown in FIG. 1A, both sides of the first end of crystal blank 2 are positioned onto conductive adhesive 7 and conductive adhesive 7 is thermally set with the second end of crystal blank 2 made to contact pillow members 8a, 8b or positioned above pillow members 8a, 8b. After this, covering the recess with metal cover 5 completes the crystal unit. In the crystal unit manufactured in this way, when a shock is applied, swinging in the vertical direction of crystal blank 2 on the second end side is suppressed by pillow members 8a, 8b.

Furthermore, when the second end of crystal blank 2 needs to be fixed, silicon-based thermosetting conductive adhesive 7 is applied onto holding terminals 3 and bank 10 as described above, both sides of the first end of crystal blank 2 are positioned to the conductive adhesive on holding terminals 3, the center of the second end is positioned on conductive adhesive 7 on bank 10 and then conductive adhesive 7 is thermally set. In this case, both sides of the second end of crystal blank 2 contact pillow members 8a, 8b or are fixed above in proximity to pillow members 8a, 8b. After that, covering the recess with metal cover 5 completes the crystal unit. In the crystal unit manufactured in this way, the distance from the surface of bank 10 to the under surface of crystal blank 2 can be made smaller than the distance from the inner bottom surface of the recess to the under surface of crystal blank 2. Therefore, compared to the case where an adhesive is directly applied onto the inner bottom surface of the recess, the thickness of the adhesive for fixing the second end of crystal blank 2 can be reduced, and it is thereby possible to make the under surface of crystal blank 2 contact the adhesive without increasing the amount of this adhesive. Compared to the case where the amount of adhesive is increased, this makes it possible to reduce the area of adhesive adhered to the principal surface of crystal blank 2, maintain the vibration characteristic of the crystal blank satisfactorily and improve the anti-shock characteristic against peeling or the like.

Since the difference in height between pillow members 8a, 8b and bank 10 corresponds to the thickness of conductive adhesive 7, the thickness of conductive adhesive 7 can be increased compared to the case where the adhesive is applied onto the pillow members and the thickness of conductive adhesive 7 can be adjusted by adjusting the height of bank 10. Generally, the greater the thickness of an adhesive, the larger the elasticity becomes, and the elasticity of conductive adhesive 7 increases compared to the case where the adhesive is applied to the pillow members. This makes it possible to further reduce influences of a difference in thermal expansion coefficient between the container body and crystal blank on the vibration characteristic of the crystal blank and frequency-temperature characteristic in particular.

In this embodiment, the same conductive adhesive 7 as that applied onto holding terminals 3 is used as the adhesive for fixing the second end of crystal blank 2 to bank 10. Compared to the case where different kinds of adhesive are applied onto holding terminal 3 and bank 10, this makes easier the process of applying the adhesive. Since first layer 8x is formed common to and continuous between two pillow members 8a, 8b, it is possible to improve the positional accuracy in forming the respective layers using a printing method compared to the case where two pillow members are formed completely independently of each other.

In this way, this embodiment allows the container body to be used commonly for the case where pillow members are provided and crystal blank 2 is placed on or above the pillow members to suppress oscillation and the case where the second end of crystal blank 2 is also fixed to the container body using an adhesive, and can thereby improve productivity.

Figure 5:
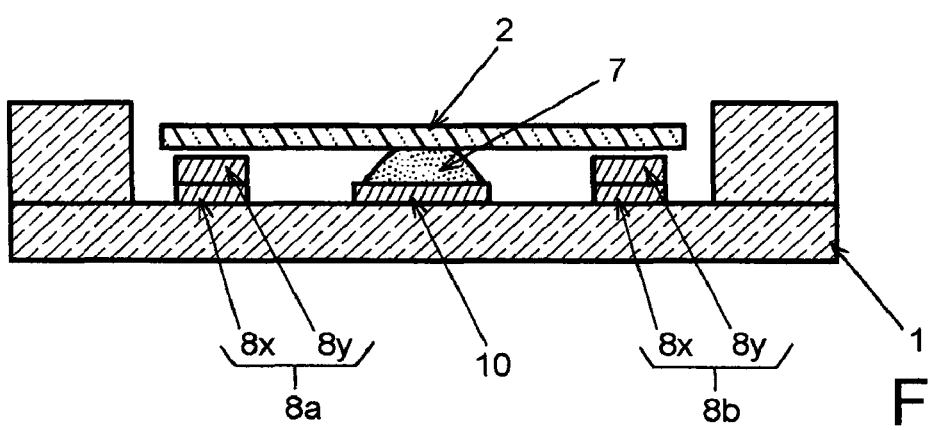
FIG. 5 is an enlarged cross-sectional view showing a crystal unit for surface mounting according to another embodiment of the present invention.

In the above described embodiment, first layer 8x is provided commonly for pillow members 8a, 8b, second layer 8y is provided for each of the pillow members and the exposed part of first layer 8x is used as bank 10, but the present invention is not limited to this. As shown in FIG. 5, pillow members 8a, 8b may be provided independently of each other and bank 10 may be formed independently of pillow members 8a, 8b. In this case, suppose both pillow members 8a, 8b have a two-layer structure of first layer 8x and second layer 8y and bank 10 has a single-layer structure.

In the present invention, an insulating adhesive may also be used as the adhesive applied onto the surface of bank 10 instead of above described conductive adhesive 7

What is claimed is:

1. A crystal unit for surface mounting comprising:
   a container body having a recess;
   a pair of holding terminals formed on an inner bottom surface of the recess; and
   a crystal blank provided with excitation electrodes on both principal surfaces thereof, having a first end and a second end with lead-out electrodes extending from the pair of excitation electrodes toward both sides of the first end, wherein both sides of the first end of the crystal blank are fixed to the holding terminals using a conductive adhesive,
   pillow members protruding from the inner bottom surface are provided on the inner bottom surface of the recess at positions corresponding to corners on both sides of the second end of the crystal blank, each of the pillow members having a two-layer structure of conductive material which comprises a first layer provided on the inner bottom surface and a second layer provided on the first layer,
   a bank having a thickness lower than a thickness of the pillow members is provided on the inner bottom surface of the recess at an intermediate position between the pair of pillow members, the bank is formed as an exposed part of the first layer,
   the holding terminals and the pillow members are formed on the inner bottom surface at the same time,
   the first layer is formed common to and continuous between the pair of pillow members and the second layer provided on the first layer for each of the pillow members.

2. The crystal unit according to claim 1, wherein the crystal blank has a quasi-rectangular shape.

3. The crystal unit according to claim 1, wherein the crystal blank is an AT-cut quartz crystal blank.

4. The crystal unit according to claim 1, wherein the crystal blank is fixed onto the bank at a center position of the second end using an adhesive.

5. The crystal unit according to claim 4, wherein the adhesive is a conductive adhesive.

6. The crystal unit according to claim 1, wherein each of the holding terminal comprises a two-layer structure which is the same as the two-layer structure of each of the pillow members.

7. A surface-mount crystal unit comprising a crystal blank and a container body, wherein lead-out electrodes are extended from excitation electrodes of the crystal blank toward both sides of an end in a longitudinal direction of the crystal blank, the both sides of the one end are fixed by conductive adhesive to holding terminals which are provided on an inner bottom surface of the container body at both sides in one end of the container body, and the other end in the longitudinal direction of the crystal blank is located on or above pillow members,
   wherein each of said pillow members has a two-layer structure,
   said pillow members are arranged along a width direction at both sides of the other end of the container body,
   a bank having a thickness smaller than a thickness of each of the pillow members is arranged on the inner bottom surface at the other end of the container body, the bank located in a center portion in the width direction,
   the pillow members have a two-layer structure which comprises a first layer linearly and contiguously provided on the inner bottom surface and a second layer provided on the first layer at both ends in the width direction,
   an exposed part of the first layer is used as the bank, and
   the crystal blank is fixed onto the bank at a center position of the other end of the crystal blank using a conductive adhesive.

* * * * *

UNITED STATES PATENT AND TRADEMARK OFFICE
CERTIFICATE OF CORRECTION

PATENT NO. : 7,969,071 B2
APPLICATION NO. : 12/328203
DATED : June 28, 2011
INVENTOR(S) : Katsunori Akane et al.

It is certified that error appears in the above-identified patent and that said Letters Patent is hereby corrected as shown below:

On the Title Page, Item (73): Assignee, delete "Nithon Dempa Kogyo Co., Ltd (JP)" and insert therefore -- Nihon Dempa Kogyo Co., Ltd. (JP) --

Signed and Sealed this
Sixth Day of March, 2012

David J. Kappos
*Director of the United States Patent and Trademark Office*